United States Patent [19]

Allen et al.

[11] Patent Number: 5,736,002
[45] Date of Patent: Apr. 7, 1998

[54] METHODS AND EQUIPMENT FOR ANISOTROPIC, PATTERNED CONVERSION OF COPPER INTO SELECTIVELY REMOVABLE COMPOUNDS AND FOR REMOVAL OF SAME

[75] Inventors: Lynn Renee Allen, Camas; John Martin Grant, Vancouver, both of Wash.

[73] Assignees: Sharp Microelectronics Technology, Inc., Camas, Wash.; Sharp Kabushiki Kaisha, Osaka, Japan

[21] Appl. No.: 293,821

[22] Filed: Aug. 22, 1994

[51] Int. Cl.$^6$ .................. H01L 21/32; H01L 21/302; H01L 21/306

[52] U.S. Cl. ............... 156/628.1; 156/643.1; 156/646.1; 156/651.1; 156/656.1

[58] Field of Search .............. 156/643.1, 646.1, 156/651.1, 656.1, 628.1

[56] References Cited

U.S. PATENT DOCUMENTS

| | | | |
|---|---|---|---|
| 3,883,379 | 5/1975 | Tokarz | 156/2 |
| 4,468,284 | 8/1984 | Nelson | 156/643 |
| 4,919,750 | 4/1990 | Bausmith et al. | 156/643 |
| 5,016,563 | 5/1991 | Murakami et al. | 118/723 |
| 5,238,913 | 8/1993 | Coppa | 156/655 |
| 5,350,484 | 9/1994 | Gardner et al. | 156/628.1 |

FOREIGN PATENT DOCUMENTS

| | | |
|---|---|---|
| 02306631 | 12/1990 | Japan. |
| 04324932 | 11/1992 | Japan. |
| 06326101 | 11/1994 | Japan. |

OTHER PUBLICATIONS

R. A. Gottscho, C.W. Jurgensen and D.J. Vitkavage, "Microscopic Uniformity in Plasma Etching", J. Vac. Sci. Tech. B, 10(5), p. 2133, 1992.

L. Qushair, S. Bobbio, F. Tranjan, T. DuBois, S. Bothra, W. Rogers, A. El Hussein and J. Bousaba, "Magnetron RIE of Polysilicon and Copper Films in $Br_2$", ECS Spring Meeting, Abs. 263, 1993.

K. Ohno, M. Sato and Y. Arita, "Fine Copper Pattern Formation Using RIE with $SiCl_4$, $N_2$, $Cl_2$ $NH_3$ Mixture and its Electromigration Characteristics", ECS Spring Meeting, Abs. 318, 1993.

Mark J. Hampden–Smith and Toivo T. Kodas of University of New Mexico, "Copper Etching: New Chemical Approaches", MRS Bulletin, Feb. 23, 1993.

J. Farkus, K.M. Chi, M.J. Hampden–Smith, T.T. Kodas and L.H. Dubois, "Etching of Copper and Copper Oxide at High Rates via Generation of Volatile Copper Species", MRS Symposium, Jun. 1992.

F. Rousseaum, A. Jain, T.T. Kodas, M. Hampden–Smith, J.D. Farr and R. Muenchausen, "Low Temperature Dry Etching of Metal Oxides and ZnS via Formation of Volatile Metal Beta–Diketone Complexes", J. Mater. Chem. 2(8), pp. 893–894, 1992.

"Silicon Processing For The VLSI Era—vol. 2—Process Integration", Wolf; ©1990; Lattice Press; Sunset Beach, Ca.; pp. 193–194, 132–134.

*Primary Examiner*—R. Bruce Breneman
*Assistant Examiner*—George Goudreau
*Attorney, Agent, or Firm*—Fliesler, Dubb, Meyer & Lovejoy

[57] ABSTRACT

Methods and equipment for anisotropic, patterned conversion of copper into selectively removable compounds and for removal of the same are disclosed. In one embodiment a plasma reactor is used to anisotropically convert unmasked portions of a copper layer at low temperature into copper chloride. The copper chloride is removed by one or more of the following steps: (1) solvation by a solvent specific to the copper chloride; (2) vaporizing the copper chloride away; and (3) converting the copper chloride into a volatile, secondary compound. In another embodiment an ion implanter is used to anisotropically convert desired portions of a copper layer into copper oxide. The copper oxide is removed by one or more of the following steps: (1) solvation by a solvent specific to the copper oxide; (2) vaporizing the copper oxide away; and (3) converting the copper oxide into a volatile, secondary compound.

2 Claims, 10 Drawing Sheets

METHODS AND EQUIPMENT FOR ANISOTROPIC, PATTERNED CONVERSION OF COPPER INTO SELECTIVELY REMOVABLE COMPOUNDS AND FOR REMOVAL OF SAME

BACKGROUND

1. Field of the Invention

The invention relates generally to patterning films of copper or copper-based alloys. The invention relates more specifically to production-speed patterning of copper interconnect layers on a semiconductor-based integrated circuit.

2a. Cross Reference to Related Applications

The following copending U.S. patent application(s) is/are assigned to the assignee of the present application, is/are related to the present application and its/their disclosures is/are incorporated herein by reference:

(A) Ser. No. 08/036,049 filed Mar. 23, 1993 by Greg Allen and entitled, IMPLANTATION OF NUCLEATING SPECIES FOR SELECTIVE METALLIZATION AND PRODUCTS THEREOF;

(B) Ser. No. 07/861,141 filed Mar. 31, 1992 by Tatsuo Nakato and entitled, GRADED IMPLANTATION OF OXYGEN AND/OR NITROGEN CONSTITUENTS TO DEFINE BURIED ISOLATION REGION IN SEMICONDUCTOR DEVICES (issued May 7, 1996 as U.S. Pat. No. 5,514,897);

(C) Ser. No. 07/954,505 filed Sep. 29, 1992 by David Vidusek et al, and entitled, LITHOGRAPHIC PROCESS FOR PRODUCING SMALL MASK APERTURES AND PRODUCTS THEREOF issued Apr. 4, 1995 as U.S. Pat. No. 5,403,685).

2b. Cross Reference to Related Patents

The following U.S. patent(s) is/are related to the present application and its/their disclosures is/are incorporated herein by reference:

(A) U.S. Pat. No. 4,919,750 issued Apr. 24, 1990 to Bausmith et al, and entitled, "Etching Metal Films with Complexing Chloride Plasma".

2c. Cross Reference to Related Other Publications

The following publications are believed to be related to the present application and are cited here for purposes of reference:

(A) Mark J. Hampden-Smith and Toivo T. Kodas of University of New Mexico, "Copper Etching: New Chemical Approaches", MRS Bulletin, Feb. 23, 1993;

(B) J. Farkus, K. M. Chi, M. J. Hampden-Smith, T. T. Kodas and L. H. Dubois, "Etching of Copper and Copper Oxide at High Rates via Generation of Volatile Copper Species", MRS Symposium, June, 1992;

(C) F. Rousseau, A. Jain, T. T. Kodas, M. Hampden-Smith, J. D. Farr and R. Muenchausen, "Low Temperature Dry Etching of Metal Oxides and ZnS via Formation of Volatile Metal Beta-Diketone Complexes", J. Mater. Chem. 2(8), pp. 893–894, 1992;

(D) R. A. Gottscho, C. W. Jurgensen and D. J. Vitkavage, "Microscopic Uniformity in Plasma Etching", J. Vac. Sci. Tech. B, 10(5), p. 2133, 1992;

(E) J. W. Coburn, "Plasma Etching and Reactive Ion Etching", AVS Monograph Series, 1982;

(F) L. Qushair, S. Bobbio, F. Tranjan, T. DuBois, S. Bothra, W. Rogers, A. El Hussein and J. Bousaba, "Magnetron RIE of Polysilicon and Copper Films in Br2", ECS (Electro Chemical Society) Spring Meeting, Abs. 263, 1993; and (G) K. Ohno, M. Sato and Y. Arita, "Fine Copper Pattern Formation Using RIE with $SiCl_4$, $N_2$, $Cl_2$ and $NH_3$ Mixture and its Electromigration Characteristics" ECS Spring Meeting, Abs. 318, 1993.

3. Description of the Related Art

The semiconductor industry has long felt the need to create integrated circuits with ever faster performance speeds and ever lower production costs. One of the techniques for achieving this goal is through the continuous miniaturization of circuit components and interconnect. Another is through the substitution of materials.

Recently, the industry has begun to consider the use of copper and/or copper-based alloys within integrated circuits for forming metal interconnect. The copper is to be used in place of more traditional metal interconnects made of aluminum and/or tungsten alloys. Copper has lower resistivity than the traditional materials and should therefore allow for faster signal propagation. But copper also has other properties that make its use in the miniaturized world of integrated circuits difficult.

One of the heretofore-unsolved problems is how to pattern copper into conductive lines or other areas of desired shape and size in a rapid and economical fashion when the copper is laid down on a semiconductor wafer.

Traditional wet etch techniques such as those used in the manufacture of copper-clad printed circuit boards (e.g., use of ferric chloride solution) turn out to be relatively useless in the miniaturized world of integrated circuits. There are several reasons.

First, the wet etch process is isotropic, meaning that it tends to undercut into all exposed portions of the copper including portions situated below the resist pattern. The undercut effect is undesirable because it makes it difficult to assure that conductive metal lines of uniform width will be created from one wafer batch to the next.

Second, in cases where the line width dimensions of a copper conductor approach or descend below those of line thickness (e.g., width $\leq$ approximately 2 times thickness), the isotropic undercut can be so significant that it creates an undesired open in the line.

Third, the step of controlling the rate of copper removal in a wet etch process is both difficult and critical. One has to stop the etch process within a finely tuned time window such that all portions of the copper that one wishes to remove are assuredly removed but such that excessive undercutting is prevented. If the wet etch process is halted too soon, undesirable shorts may be left between conductor lines. If the wet etch process is terminated too late, undesirable opens or high resistance points may be created along conductor lines.

Some workers in the field have proposed selective deposition as an alternative to wet etching. To date, most selective copper deposition techniques are not viable on their own for patterning copper in commercial settings because, among other problems, such techniques exhibit relatively poor selectivity.

Others workers in the field are exploring ion beam etching and plasma etching as alternatives. Ion beam etching and plasma etching suffer from process duration problems similar to those of wet etching. If the etch process is terminated too soon, undesirable shorts are left between conductor lines. If the plasma/ion beam etch process is halted too late, the etch may cut excessively into the layer underlying the copper and create problems there.

Plasma etching additionally suffers from the problem of requiring high temperatures for volatilizing its reaction products as they are formed. Commonly used halide etch gases form surface products that have vaporization temperatures well above room temperature, such as at 160° C. or higher. As a result, the plasma chamber has to be heated to a temperature that may be detrimental to chamber components such as pressure seals, wafer-transport subsystems and so forth. If the wafers are held at high temperature for too long a time, this may be detrimental to the stability of underlying features such as previously implanted dopants. The dopants might diffuse outside the regions they were intended to be confined to thereby changing device characteristics. It is desirable to avoid subjecting wafers to excessive temperatures for excessively long periods of time. It is further desirable to avoid having to create such high temperature environments because of wear and tear on the manufacturing equipment, because of the energy costs involved and because of the time needed to ramp up to the high temperatures and to later ramp down to ambient temperature.

A need therefore persists in the industry for a copper patterning process that is immune to process variations. A need exists for a copper patterning process that is rapid and cost efficient when carried out in a commercial setting. A need further exists for a copper patterning process that can be carried out at relatively low process temperatures.

SUMMARY OF THE INVENTION

The invention overcomes the above-mentioned problems by providing methods and equipment for anisotropic, patterned conversion of copper into selectively removable compounds and for removal of the same.

In one embodiment, copper is blanket deposited onto a substrate. A masking layer is deposited on the copper and patterned by way of available lithographic processes to create apertures that expose prespecified portions of the copper. The exposed copper is chemically converted into a more-easily removable compound such as copper chloride or copper oxide by way of an anisotropic conversion process such as ion implant or plasma reactor conversion. Copper underneath the masking layer is not affected by the anisotropic conversion process and remains relatively difficult to remove.

The anisotropically-created, removable compound is then selectively removed either with a compound specific solvent, or by further chemical reaction that converts the removable compound into a volatile species or by thermal evaporation or by a combination of such compound-specific removal techniques.

A system in accordance with the invention comprises: (a) conversion means for anisotropically converting preselected portions of a copper layer into a selectively removable compound; and (b) removal means for selectively removing the removable compound while leaving behind nonconverted portions of the copper layer.

A method in accordance with the invention comprises the steps of: (a) anisotropically converting preselected portions of a copper layer into a selectively removable compound; and (b) selectively removing the removable compound while leaving behind nonconverted portions of the copper layer.

BRIEF DESCRIPTION OF THE DRAWINGS

The below detailed description makes reference to the accompanying drawings, in which.

DETAILED DESCRIPTION

Figure 1:
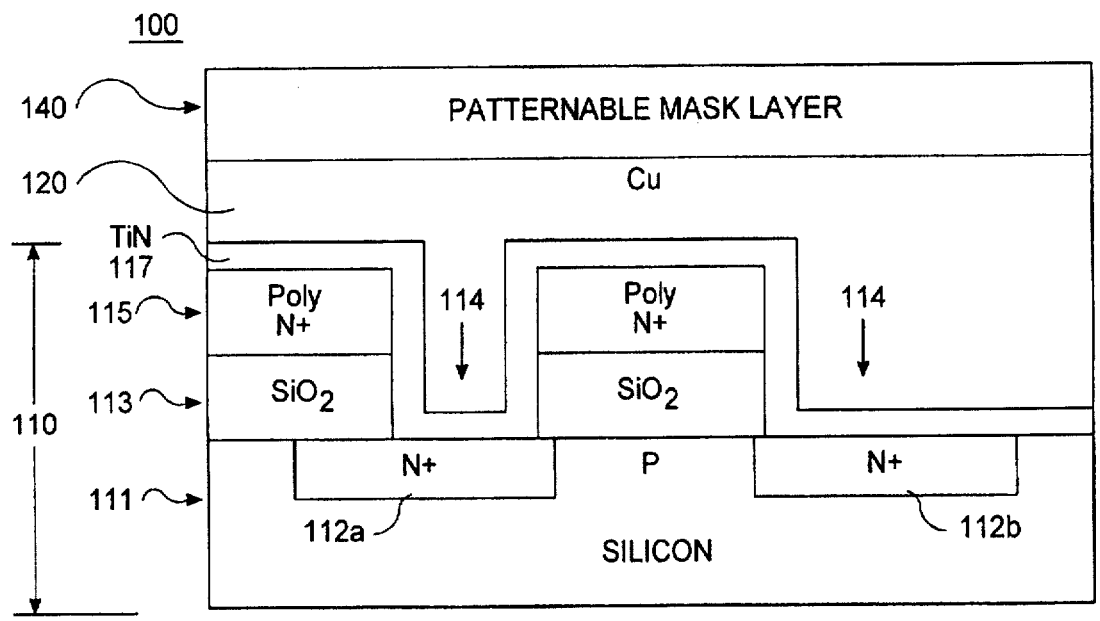
FIG. 1 is a cross sectional side view showing a first step wherein a substrate is blanket covered with a copper-based layer and an overlying mask layer.

Referring to FIG. 1, a cross sectional side view is shown of a first intermediate structure 100 in accordance with the invention wherein a substrate 110 is blanket covered with a copper-based layer 120 and an patternable mask layer 140 is then deposited on the copper-based layer 120.

In the illustrated embodiment, the substrate 110 includes a semiconductor base portion 111 composed of, for example, P-doped monocrystalline silicon. A variety of pre-defined conductivity regions such as N+ regions 112a and 112b are formed within the base semiconductor layer 111.

The substrate 110 further includes a pre-patterned insulator layer 113 composed, for example, of silicon dioxide or silicon nitride. Openings (apertures) 114 through the insulator layer 113 serve as passageways for making conductive contact to the underlying semiconductor layer 111. The insulator layer 113 preferably has a thickness of three microns or less, but thicker dimensions may be used where desirable.

The substrate 110 of this particular embodiment 100 further includes a pre-patterned, conductive polysilicon layer 115 formed on top of the insulator layer 113. The polysilicon layer 115 can be deposited by CVD (chemical vapor deposition) or other suitable techniques. Deposition of the polysilicon layer 115 can take place prior to the creation of apertures 114. Thereafter, the polysilicon layer 115 may be patterned with well known techniques (e.g., photolithographic etching) to extend apertures 114 through both the polysilicon and the insulator layer 113. N+ doping species may then be implanted simultaneously into the patterned polysilicon layer 115 and through apertures 114 to make the polysilicon 115 conductive and to simultaneously define the N+ regions 112a and 112b in self-aligned relation to apertures 114.

The substrate 110 of this particular embodiment 100 additionally includes a conductive barrier layer 117 composed of, for example, one or more materials selected from the group comprising of: titanium nitride (TiN); titanium tungsten (TiW); titanium tungsten nitride (TiNW); tungsten nitride (WN); and simple metals such as molybdenum (Mo); chemical vapor deposited tungsten (CVD W); hafnium (Hf); and aluminum (Al). The barrier layer 117 is conformably coated by CVD or by other appropriate methods onto the polysilicon layer 115 and onto portions of the semiconductor base 111 exposed by apertures 114. The barrier layer 117 preferably has a thickness of 1.2 microns or less, but this dimension may be varied to meet specific needs. The purpose of the barrier layer 117 is to prevent undesired migration of copper from the overlying copper-based layer 120 into the semiconductor base portion 111 and/or the polysilicon layer 115.

The copper-based layer 120 is blanket deposited onto the substrate 110 by conventional methods such as chemical vapor deposition (CVD) or by other suitable methods. Layer 120 may consist essentially of copper alone or may be a copper alloy composed in bulk of more than 50 atomic per cent copper and a remainder made up substantially of one or more characteristic-enhancing, other metals. The copper content of copper-based layer 120 is preferably 80% atomic or more, and more preferably 95% atomic or more. The one or more characteristic enhancing metals that are optionally alloyed into the copper-based layer 120 preferably constitute 5% to 4% atomic, and more preferably 2% to 3% atomic or less, of nickel (Ni) and/or magnesium (Mg). The copper-based layer 120 preferably has a thickness of one micron or less, but larger thicknesses may be used as well.

The patternable mask layer 140 that is deposited on top of the copper-based layer 120 will vary in composition depending on the chemicals used in the subsequent processes for which layer 140 is to act as a mask. In the case where organic masking materials may be used, the patternable mask layer 140 may be composed of a conventional i-line photoresist composition such as UCB JSR resist or another novolac-based resist. A typical thickness for the photoresist layer is 1.8 microns or less.

In an alternate embodiment, where it is not practical to use organic masking materials in the subsequent process steps, the patternable mask layer 140 may be composed of a harder, nonorganic material such as spin-on-glass (SOG) or CVD dielectrics such as silicon oxide or silicon nitride. An SOG such as Allied 103AS may be used and spun on to a preferable, but not necessary, thickness of approximately 1.5 microns.

Figure 2:
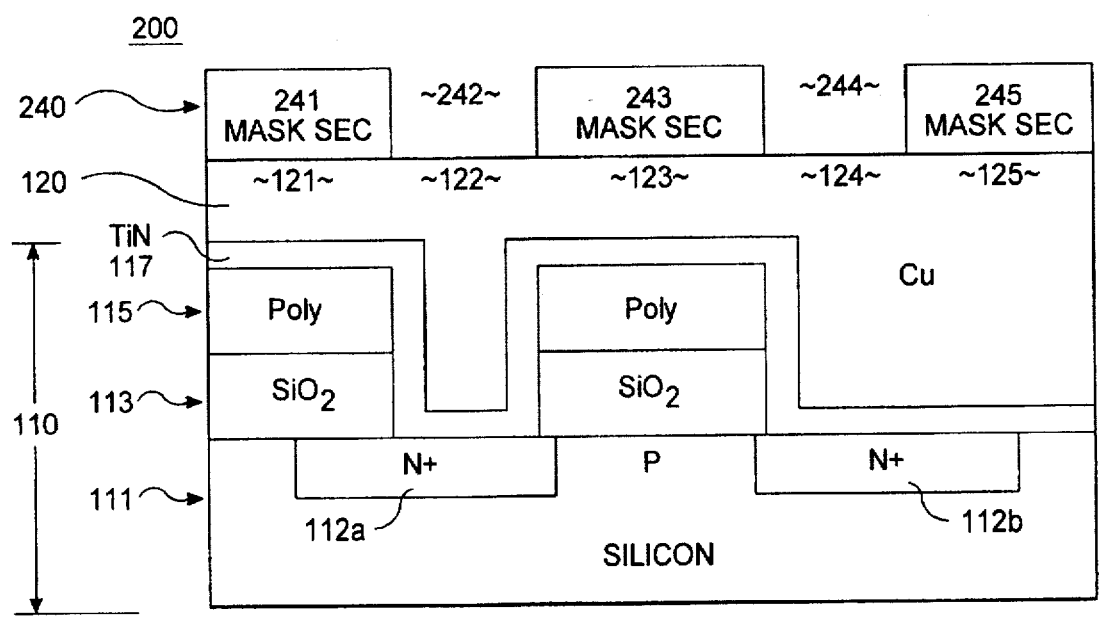
FIG. 2 is a cross sectional side view showing a second step wherein the mask layer is patterned to expose desired portions of the copper-based layer.

Referring to FIG. 2, a subsequent intermediate structure 200 is shown in cross section. The patternable mask layer 140 has been patterned by an appropriate photolithographic or other technique to define a patterned mask layer 240 having apertures 242, 244 defined therethrough. Mask sections 241, 243, 245 cover corresponding portions 121, 123, 125 of the copper-based layer 120 while adjacent other portions 122, 124 of the copper-based layer 120 are exposed by way of the mask apertures, 242, 244.

For the case where the patternable mask layer 140 is composed of a nonorganic material such as SOG, a photoresist layer (not shown) is spun on top of it and patterned through conventional process. The SOG is then etched using conventional dry etch techniques. The photoresist layer (not shown) on top of the patterned SOG is stripped off either immediately after or simultaneously with an oxidizing of the copper-based layer 120, which oxidizing step is described immediately below.

Figure 3:
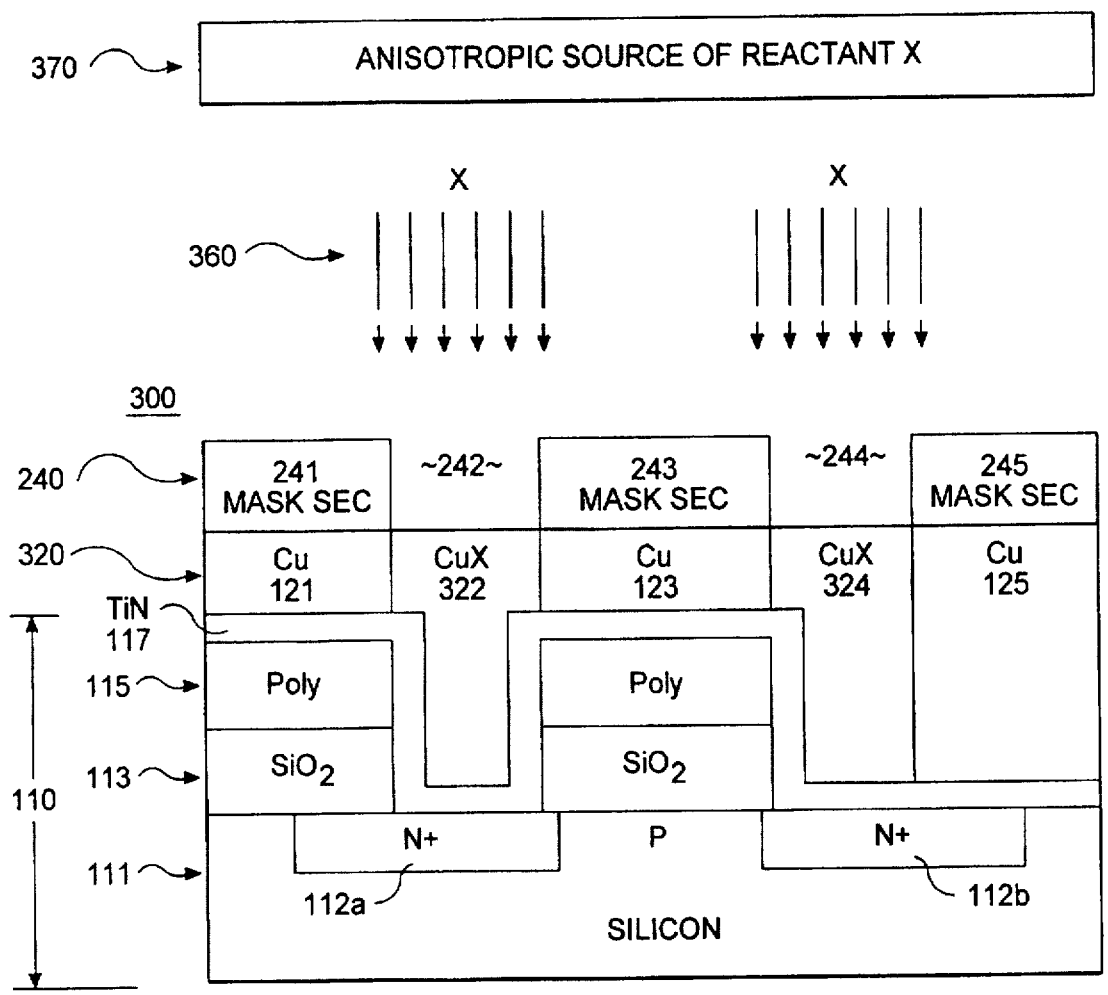
FIG. 3 is a cross sectional side view showing a third step wherein exposed sections of the copper-based layer are anisotropically converted into sections composed of a selectively removable compound (CuX)

Referring to FIG. 3, an oxidation-type reactant species (X) 360 such as chlorine (Cl) or oxygen (O) is anisotropically introduced, preferably at an angle generally perpendicular to the major surface of the patterned mask 240, into the nonmasked portions 122, 124 of the copper-based layer so as to chemically convert the nonmasked regions, 122 and 124, into respective converted regions, 322 and 324. The anisotropic introduction of the reactant species (X) 360 may be carried by way of ion implantation or plasma reactor conversion or any other means 370. The anisotropic reactant source 370 directionally accelerates the reactant species (X) 360 into the to-be-converted regions 122, 124 so as to distribute particles of the species (X) 360 in a substantially uniform manner throughout those regions 122, 124. (The depths of implant into regions 122, 124 may be set less than the full depth of these regions if desired.)

The anisotropic reactant introduction step of FIG. 3 is preferably carried out at low temperature such as 100° C. or less, and more preferably at 70° C. or less, and even more preferably at 50° C. or less so that the reactant introducing apparatus (e.g., the plasma reactor 900 of FIG. 9) is not stressed by excessive temperatures and so that time is not wasted ramping up to and ramping down from high temperature. High temperature processing after the anisotropic reactant introduction step may be carried out in a separate chamber that is designed to handle the higher temperatures (greater than 70° C. for example).

As a result of the anisotropic introduction, and optionally as a further result of rapid heat activation of chemical reaction, with mercury arc lamps for example; the copper-based regions, 122 and 124, are converted into regions composed of a selectively removable compound having the form, CuX. This selectively removable compound (CuX) is such that it is selectively removable away from the nonconverted regions 121, 123, 125 of the original copper-based layer 120 by use of a solvent or other appropriate means (e.g., thermal vaporization, described below). The partially converted copper-based layer is now referenced as layer 320 (composed of sections 121, 322, 123, 324 and 125).

In a first embodiment, the anisotropically injected species X is chlorine or another group VII member of the periodic table (a halogen) such as fluorine, bromine or iodine or a mixture of such halogens. The halogen reactant should be anisotropically introduced into the copper-based regions 122, 124 in sufficient quantity and distribution to convert the copper-based regions 122, 124 (including subsurface portions) into the respective regions 322, 324 composed of the selectively removable compound (CuX). Where necessary, heat may be applied by way of mercury-arc lamps or the like to complete and/or hasten the chemical reaction:

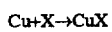

$$Cu + X \rightarrow CuX \quad \{Eq. 1\}$$

The mask layer 240 may be composed of an organic substance (e.g., novolac) that is not easily removed by the halogen reactant (X).

The chemical compounds formed by the anisotropic injection of the halogen species (X) will vary depending on the type or types of halogens injected, and the concentration and distribution of the injected species through the three-dimensional structure of regions 122, 124.

In the case where X=chlorine, it is preferable to establish concentrations of chlorine (e.g., approximately $3\times10^{23}$ atom per $cm^3$) that will favor the formation of copper (II) chloride over that of copper (I) chloride because the former compound ($CuCl_2$) is more soluble than the latter (CuCl) in water, alcohol and other solvents. However, the depth of penetration of the reactant species X will vary as a function of the thickness of the copper-based layer 120 and also as a function of the anisotropic insertion process. Since both forms of the copper chloride might form, it is desirable to make sure that substantial amounts of the more easily removable form ($CuCl_2$) develop in a uniform manner throughout the sections 122, 124 that are intended to be removed. The converted regions 322, 324 may have a three dimensional structure that includes a matrix of both copper (II) chloride and copper (I) chloride.

The below Table 1 illustrates the relative removabilities by solvent of copper, copper chlorides and other copper compounds when exposed to cold water (having a temperature equal to or less than approximately 25° C.), hot water (having a temperature equal to or greater than about 80° C.), hydrochloric acid (HCl), sulfuric acid ($H_2SO_4$), ammonia (NH4OH) and other organic solvents. Solubilities are given numerically where available in terms of milligrams per milliliter (mg/mL). Dashes (—) indicate areas where the data is not available from standard references.

TABLE 1

COPPER COMPOUND SOLUBILITIES

| Compound | Cold $H_2O$ ≤ 25° C. | Hot $H_2O$ ≥ 80° C. | Other Solvents |
|---|---|---|---|
| Copper | insoluble | insoluble | $HNO_3$, hot $H_2SO_4$, $NH_4OH$; very slightly soluble in HCl. |
| Copper (I) chloride | 0.0062 | — | soluble in ethanol, HCl, $NH_4OH$, ether; insoluble in other alcohols. |
| Copper (II) chloride | 70.6 | 107.9 | 53 alcohol, 68 methanol, soluble in hot $H_2SO_4$, acetone |
| Copper (II) chloride, basic | decomposes | decomposes | — |
| Copper (II) chloride, hydrate | 110.4 | 192.4 | soluble in alcohol, $NH_4OH$ |
| Copper Boride $Cu_3B_2$ | — | — | — |
| Copper metaborate $Cu(BO_2)$ | soluble | — | — |
| Copper (I) Oxide $Cu_2O$ | insoluble | insoluble | HCl, $NH_4Cl$, KCN, $NH_4OH$, slightly soluble in $HNO_3$ |
| Copper (II) Oxide CuO | insoluble | insoluble | soluble in acid, $NH_4Cl$, KCN |
| $CuCl_2 \cdot 3CuO \cdot 4H_2O$ | insoluble | decomposes | soluble in acid, $NH_4OH$ |

Figure 4A:
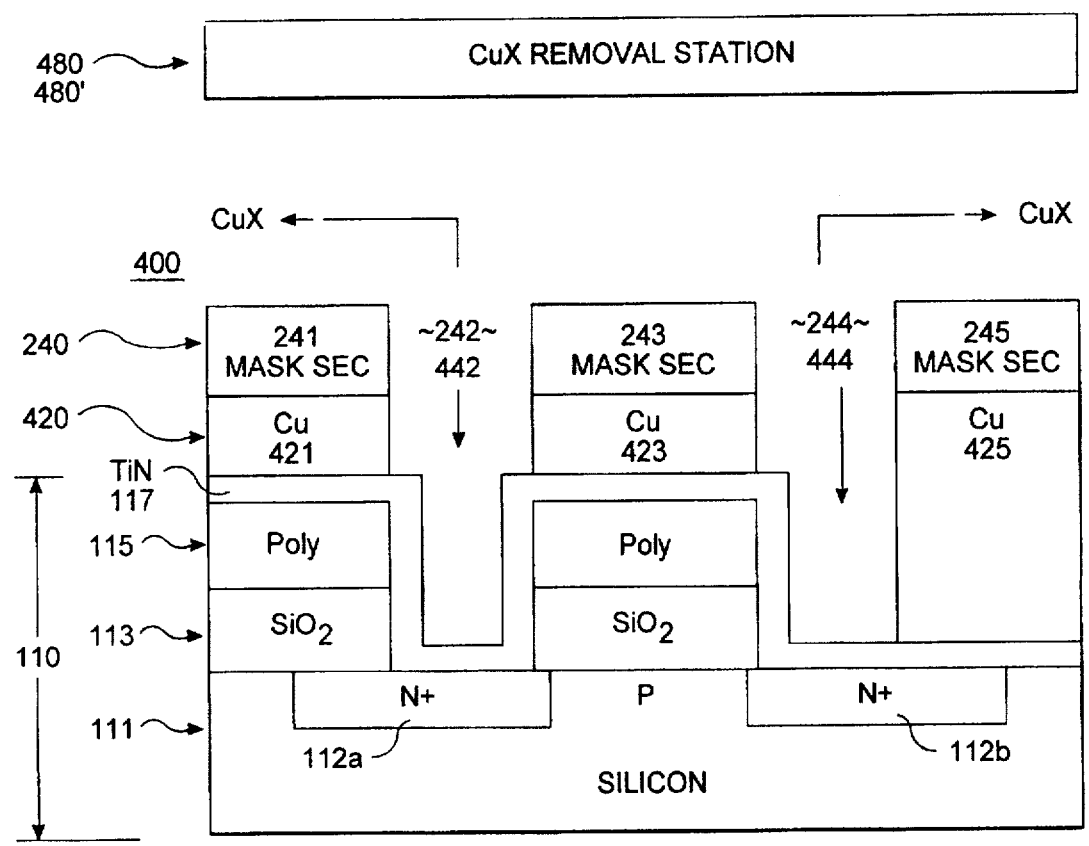
FIG. 4A is a cross sectional side view showing a fourth step wherein the removable compound sections are selectively removed.

Table 1 will be discussed in more detail when FIG. 4A is described below.

Still referring to FIG. 3, in an alternate embodiment, the anisotropically-introduced reactant X includes one or more group VI elements such as oxygen (O), and the exposed regions 122, 124 are chemically converted into corresponding cupric or cuprous compounds (e.g., CuO, $Cu_2O$). Anisotropic-introduction is again carried out by ion implantation or plasma reactor conversion. The overlying mask layer 240 should be composed of an oxygen-resistant material such as SOG or silicon oxide or silicon nitride, however, since organic materials such as novolac are easily destroyed by bombardment with oxygen.

A number of alternate paths may be followed after the anisotropic-introduction step of FIG. 3. One of the alternate paths next steps to one or all of FIGS. 4A–4C, while another next steps to FIG. 7.

Before any of these alternate pathways are explored, one important aspect of the invention should be noted with reference to FIG. 3. The boundaries of the converted regions 322, 324 (CuX) are anisotropically defined, meaning that there is none or hardly any undercutting into the copper below mask sections 241, 243, 245. Thus, the dimensions of the converted regions 322, 324 can be controlled with substantially the same precision as the dimensions of mask apertures 242, 244 and the problems of isotropic wet etching are overcome.

Also, the depth of penetration of the oxidizing species (X) 360 is controllable by the energy applied to the ion implant or plasma reactor. This control can be used to minimize the problem of excessive cutting that is attendant to ion etching. Furthermore, the barrier layer 117 limits the depth of penetration of the copper-specific etch process so that areas below the copper-based layer 120 are not damaged.

Additionally, the anisotropic reactant introduction step may be carried out at relatively low temperature (e.g., 70° C. or less) so that the reactant-introducing equipment is not stressed by having to operate at high temperature and so that there is no worry of exceeding the thermal budget of in-process wafers due to the anisotropic reactant introduction step.

Referring next to the cross-sectional view of FIG. 4A, in a first of alternate processes, the third intermediate structure 300 is brought into operative engagement with a CuX removal station which is referenced generically as 480(').

The CuX removal station 480(') is preferably spaced apart and thermally and otherwise isolated from the anisotropic reactant introducing chamber (370) so that the latter is not stressed by high temperature operation of the former (of the CuX removal station) or by removal chemicals used within the former.

In one embodiment, the CuX removal station is a rinse station that is referenced as 480. The rinse station 480 rinses the surface of structure 300 with a solvent (not shown) that is specific to the CuX regions 322, 324. This washes away the material of CuX regions 322, 324, leaving behind the illustrated fourth structure 400, which has apertures 442, 444 in place of respective converted regions 322, 324. The patterned copper-based layer is now referenced as layer 420 and the respective left-over portions are referenced as the corresponding, selectively-defined, copper-based sections 421, 423 and 425. Note that the sidewalls of these selectively-defined sections 421, 423 and 425 are anisotropically defined to be essentially perpendicular to the major surface of the underlying semiconductor base portion 111. There is essentially no undercut.

In the case where the reactant species 360 of FIG. 3 was X=chlorine, the solvent rinse preferably includes treatment with a shower of hot purified water since both copper (II) chloride and copper (I) chloride are soluble in $H_2O$, as seen from above Table 1. This should be followed with a rinse with ethanol to remove the water and residual copper (I) chloride. The temperature for the ethanol rinse is preferably in the range of about 20° C. to 78.5° C. The temperature for the hot water rinse is preferably in the range of about 50° C. to 100° C.

In the case where the reactant species 360 of FIG. 3 was X=oxygen, the solvent rinse preferably includes treatment with a shower of HCl or KCN since both CuO and $Cu_2O$ are removable with these solvents, as seen from above Table 1. The temperature for the HCl rinse is preferably in the range of about 20° C. to 30° C. (room temperature). The KCN rinse is preferably composed of an aqueous solution having approximately 33 g/cm³ to 100 g/cm³ of KCN depending on the temperature of the water.

A plasma reactor such as a Lam Research 9600™ Transformer Coupled Plasma Metal Etcher available from Lam Research of Fremont, Calif. may be used for carrying out both the step of anisotropically injecting the reactant species (X) 360 of FIG. 3 and the step of rinsing away the converted regions 322, 324 (FIG. 4). The Lam 9600™ TCP system includes a rinse station integrated with the plasma reactor chamber so that rinsing can immediately follow plasma treatment. If desired, the plasma treatment and rinsing steps may be repeated multiple times to make sure that all exposed copper in sections 122, 124 (FIG. 2) is converted to the selectively removable compound (CuX) and to further make sure that all of the removable compound (CuX) is removed by the solvent rinse. (A description of the Lam etcher may be found in U.S. Pat. No. 4,948,458, issued Aug. 14, 1990, said description being incorporated herein by reference.)

In another embodiment, the CuX removal station 480(') is a rapid thermal vaporization station (RTP) that is referenced as 480'. An example of such an RTP station is the AG Integra One™ which is available from AG Associates Inc. of Fremont, Calif. The vaporization station 480' selectively removes the CuX compound by vaporization. This applies primarily to the case where the reactant species 360 of FIG. 3 is a halogen such as X=chlorine, and the resultant, selectively removable compound (CuX) is of a type that becomes volatile when heated to a temperature below that which is detrimental to other components of the FIG. 3 structure, 300.

Copper (II) chloride vaporizes at approximately 250° C. Copper fluoride vaporizes at approximately 300° C. Copper oxide vaporizes at approximately 400°–500° C. Elemental copper vaporizes at a much higher temperature of approximately 2000° C. In theory, copper chloride, copper fluoride and copper oxide can all be selectively removed from copper by vaporization. Many semiconductor devices cannot withstand heat treatments above approximately 300° C. for prolonged time durations, however. If the temperature is excessive or applied over too long a time period, undesired dopant diffusion and other migration processes may take place.

It is important therefore, that temperature during the removal-by-vaporization process should be limited to a tolerable level and that it should not be applied for a period exceeding the thermal budget of the device under fabrication. It is further important to keep the vaporization station 480' free of infusive problem-gases such as chlorine during the removal-by-vaporization process. Chlorine atoms have a tendency to migrate into the copper/substrate interface when present in the ambient. This can lead to corrosion problems later on.

Figure 4B:
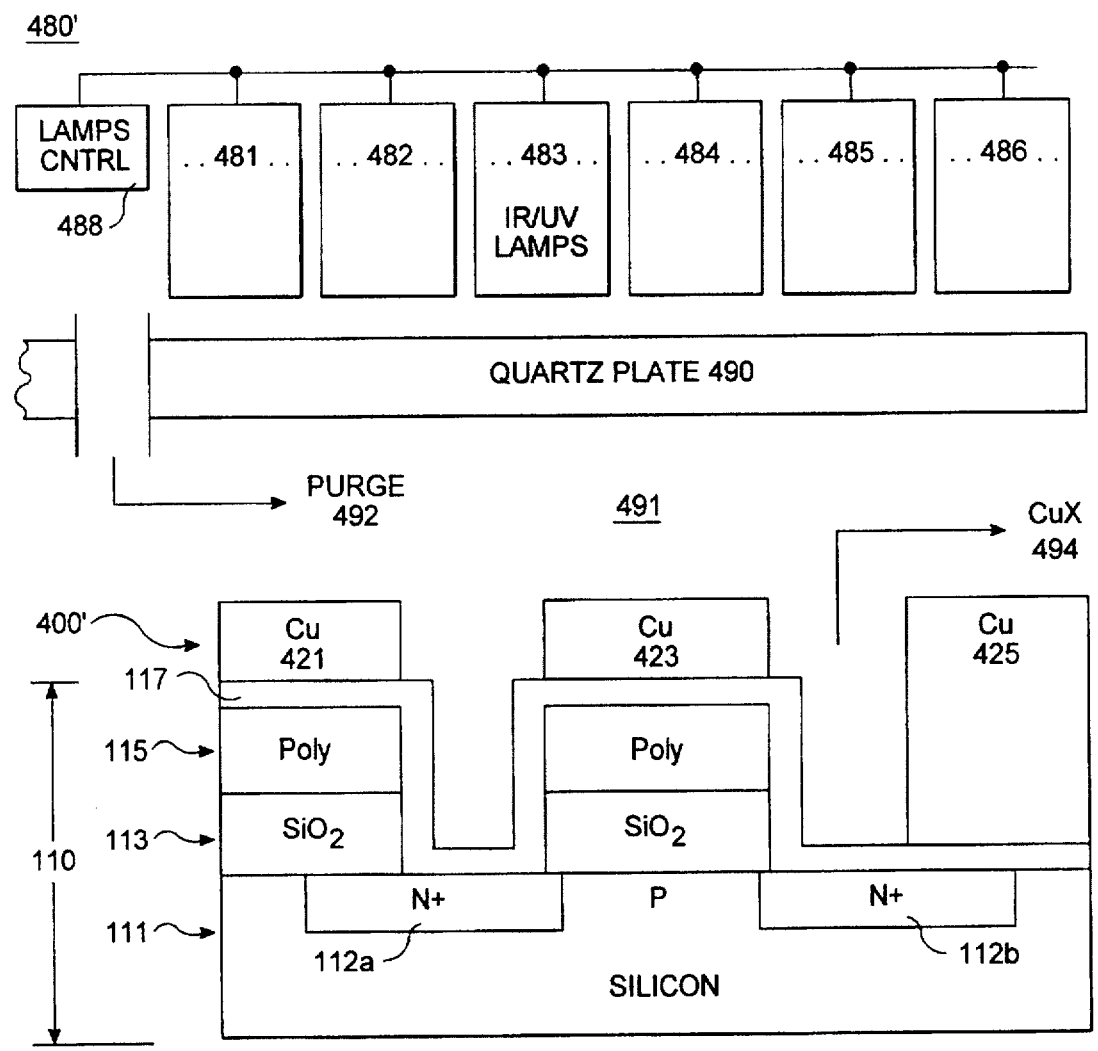
FIG. 4B is a cross sectional schematic of a rapid thermal processing (RTP) system that is used in accordance with the invention to selectively remove the removable compound (CuX) by vaporization.

Referring to FIG. 4B, prior to vaporization, the patterned mask layer 240 is first stripped away by oxide etch or other appropriate techniques to make sure that it does not produce undesired vapors. The vaporization station 480' is then purged of potentially-corrosive gases prior to the application of vaporizing heat. An inert gas such as argon is preferably flowed through the chamber both prior to and during vaporization at a pressure of less than or equal to 1 mTorr (one milli Torr) and more preferably at a pressure in the range of $10^{-4}$ to $10^{-6}$ Torr. Other relatively inert gases such as helium or nitrogen may also be used for purging the chamber before and/or during vaporization.

As shown in FIG. 4B, a gridwork of mercury arc lamps 481–486 is centered over the wafer 400' for outputting radiant energy in one or both of the infrared (IR) and ultraviolet (UV) wavelength regions. The radiant energy passes through a wide-spectrum window 490 (e.g., a quartz or sapphire plate) into a low-pressure vaporization chamber 491 for absorption by the CuX regions 322, 324 (FIG. 3) and/or other parts of the wafer 400'. Low pressure purge gas 492 (e.g., argon at $10^{-4}$ Torr) flows through the vaporization chamber 491 to remove the vaporized CuX material 494.

Figure 4C:
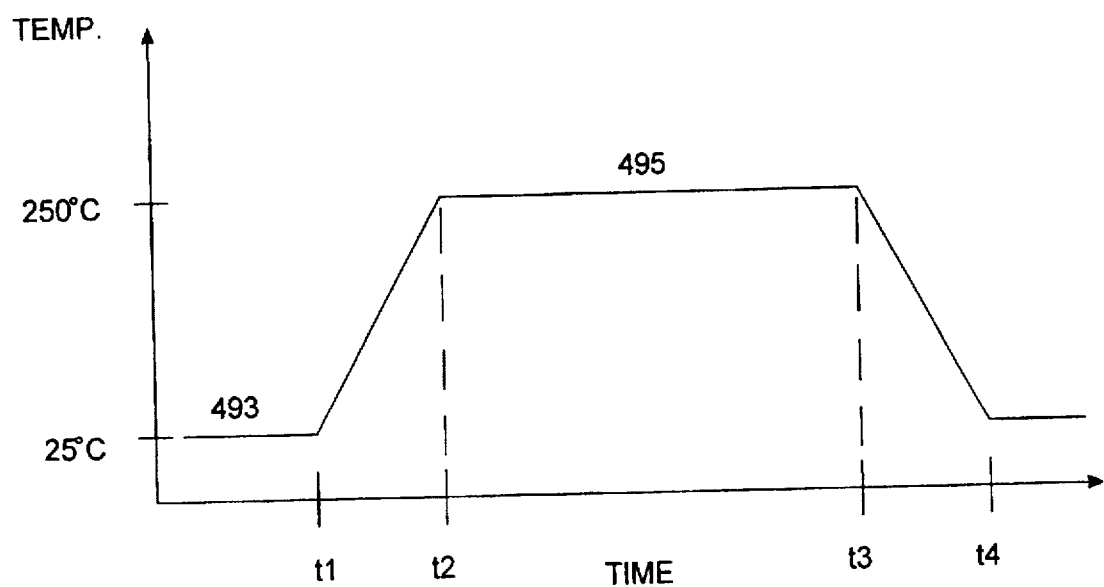
FIG. 4C is a temperature versus time plot showing a method of operating the rapid thermal processing (RTP) system of FIG. 4B.

A lamps-control module 488 is operatively coupled to the mercury arc lamps 481–486 and to the wafer 400' for controlling the temperature of the CuX regions 322, 324. FIG. 4C shows a temperature control profile that may be used for selectively vaporizing copper chloride away from semiconductor wafer 400'. The temperature is ramped up quickly between time points t1 and t2 from the ambient temperature 493 (e.g., 25° C.) to a vaporization level 495 (e.g., 250° C. for copper chloride, 300° C. for copper fluoride) of the CuX regions 322, 324. The time span between points t1 and t2 is typically 10 to 15 seconds or less. The vaporization level 495 is then maintained for a sufficiently long time span (points t2 to t3) to vaporize through the thickness (or a predetermined fraction) of the CuX regions 322, 324. The time span between points t2 and t3 is typically 1 to 5 minutes. Then the power to the mercury arc lamps 481–486 is reduced to quickly ramp the temperature of the wafer 400' back down to the ambient temperature 493 between time points t3 and t4.

A step of rinsing with a solvent specific to the CuX material may precede and/or follow the vaporization step in order to make sure that substantially all the CuX material is removed.

As will be appreciated by those skilled in the art, alternatives to vaporization in a low-pressure RTP chamber include vaporization in a diffusion furnace or in a high-temperature vacuum oven.

Figure 5:
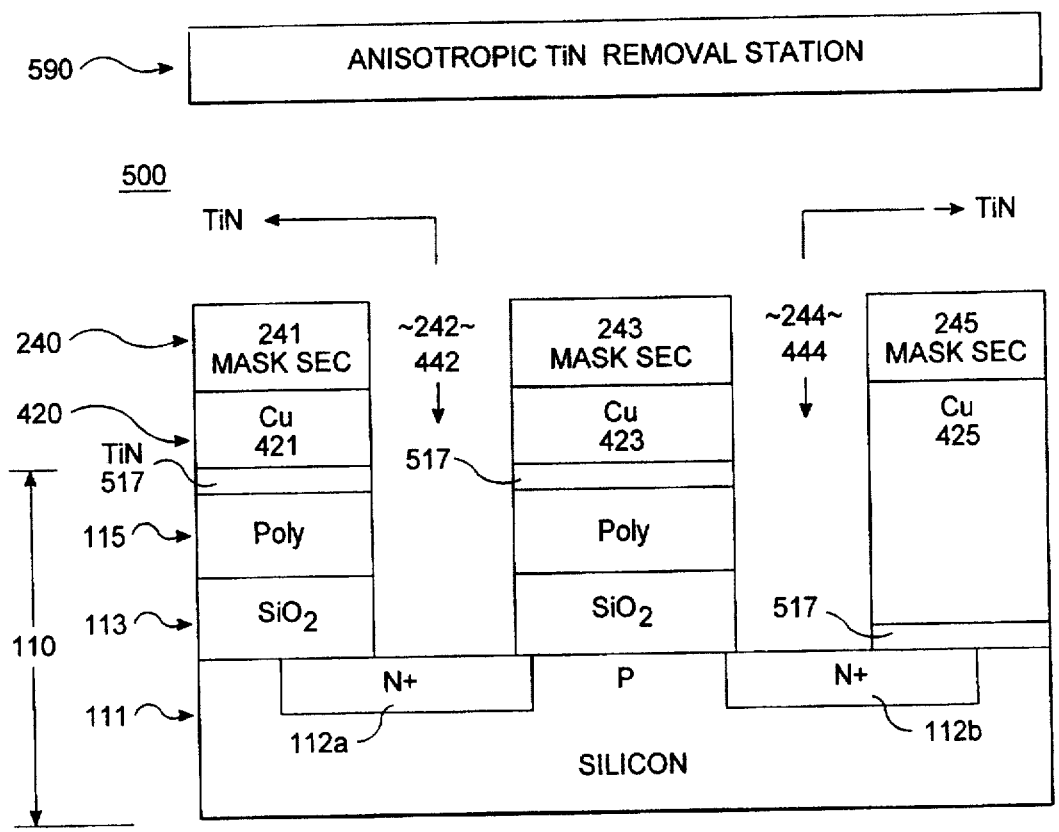
FIG. 5 is a cross sectional side view showing a fifth step wherein portions of a barrier layer below the selectively removed removable compound sections are also removed.

Referring to FIG. 5, after the material of nonmasked portions 122, 124 (FIG. 2) is removed (by way of solvation and/or by way of vaporization and/or byway of treatment with a volatilizing second reactant (see FIG. 7)), the exposed portions of the barrier layer 117, including sidewalls, are next removed anisotropically at barrier-layer removing station 590. This can be accomplished by way of reactive ion etch and/or other appropriate means. Copper sections 421, 423 and 425 and mask sections 241, 243, 245 protect sections 517 of the barrier layer from removal. The side edges of the remaining barrier sections 517 are therefore self-aligned to, and do not undercut, the side edges of the copper sections 421, 423 and 425. As such, the remaining barrier sections 517 thereafter provide effective protection from contamination by migrating copper to the layers (e.g., 115) that underlie the barrier layer sections 517.

Figure 6:
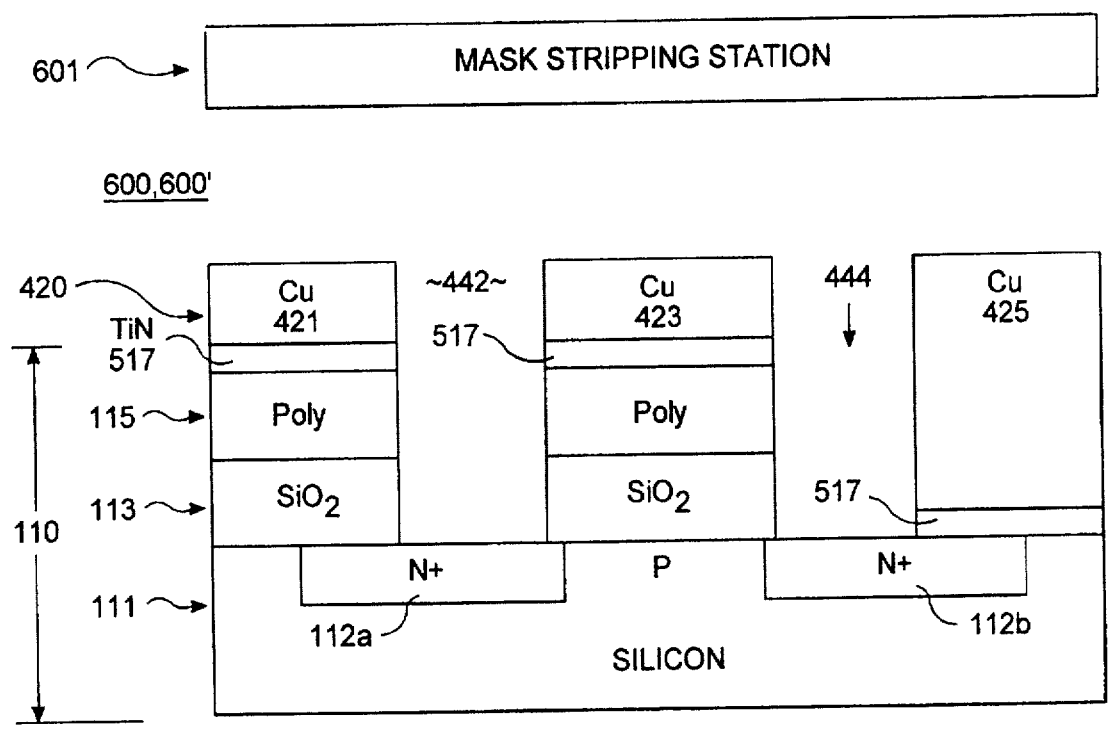
FIG. 6 is a cross sectional side view showing a sixth step wherein the patterned mask layer is removed.

Referring to FIG. 6, if the mask sections 241, 243, 245 have not yet been stripped away by a previous step, they are now removed at a mask-stripping station 601. The resulting wafer structure 600 now has the patterned copper-based portions 421, 423, 425 at its top and the patterned sections of barrier material (e.g., TiN) 517 underlying the copper-based portions. Copper-based portion 425 connects to N+ region 112$b$ by way of the corresponding barrier layer section 517. Copper-based portions 421 and 422 similarly connect to respective sections of the patterned polysilicon layer 115. As will be appreciated by those skilled in the art, the N+ regions 112$a$ and 112$b$ can respectively define the source and drain portions of a field-effect transistor (FET) while the intermediate polysilicon section 115 can serve as the gate of the transistor. In this case, copper section 425 serves as a metal drain contact and copper section 423 serves as a metal gate contact. Connection to the N+ source region 112$a$ is understood to be made elsewhere.

Further processing of the resulting semiconductor structure 600 (FIG. 6) can include passivation with an overcoat of SOG, followed by addition of one or more copper-based, or other-metal, interconnect layers if desired.

Figure 7:
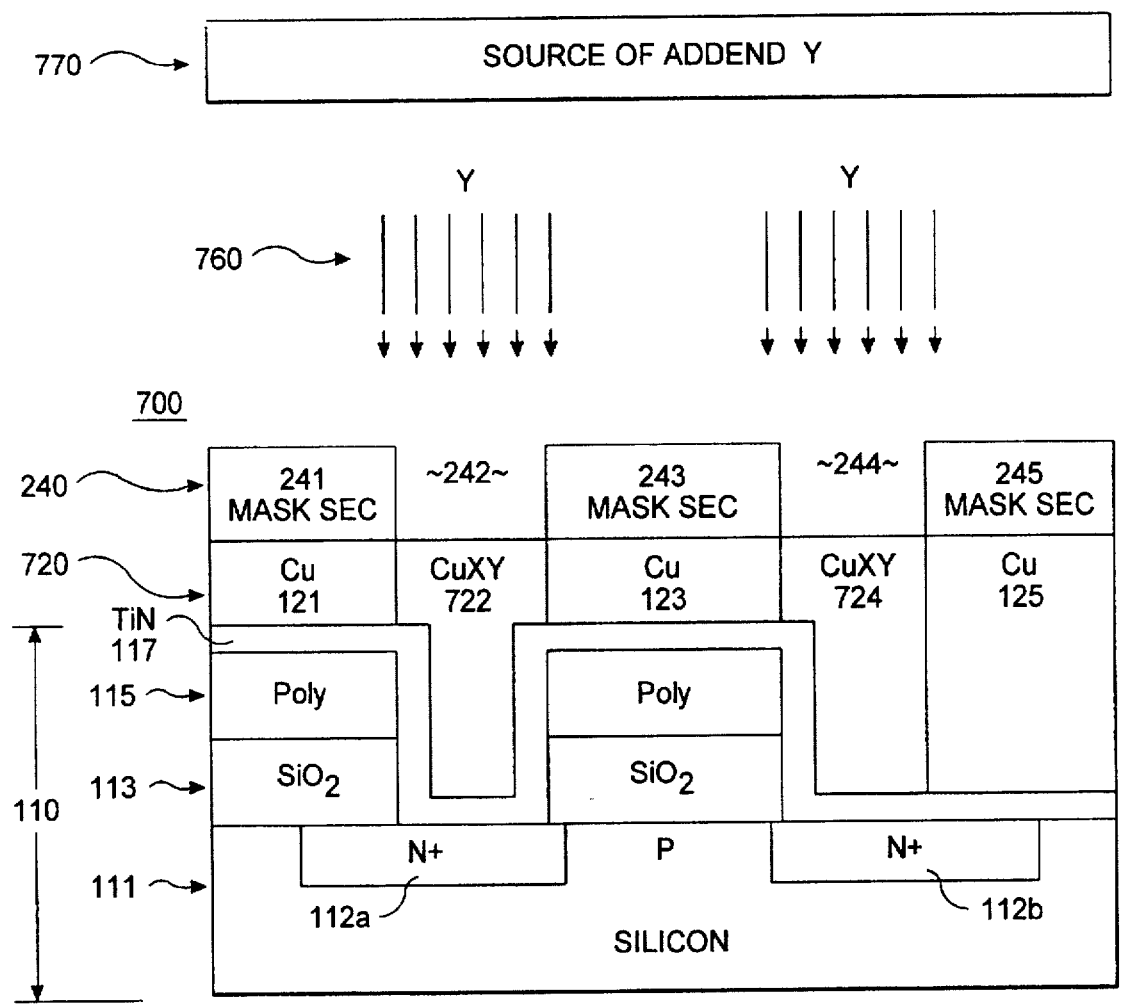
FIG. 7 is a cross sectional side view showing an alternate step following the third step of FIG. 3, wherein the anisotropically-created selectively removable compound (CuX) is further chemically converted into a more-easily removable, second compound (CuXY)

Returning briefly to FIG. 3, another patterning pathway proceeds next to a second chemical conversion step as shown in FIG. 7 rather than directly to the CuX removal step of FIG. 4A. The CuX sections 322, 324 that were formed in FIG. 3 are each converted into a second compound of the form, CuXY, by the chemical reaction:

$$CuX + Y \rightarrow CuXY \qquad \{Eq. 2\}.$$

The second compound (CuXY) is preferably one that is selectively removable from the copper-based layer with substantially more ease than the first compound (CuX) and/or at a faster rate. The twice converted regions are now referenced as CuXY regions 722 and 724 while the copper-based layer that contains copper-based portions 121, 123, 125 and CuXY regions 722 and 724 is referenced as 720.

In one embodiment, the first reactant X is chlorine while the second addend Y includes PEt$_3$. (The latter is a short hand notation for triethylphosphine.) The 2 step reaction proceeds as follows:

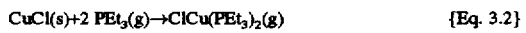

$$Cu(s) + \tfrac{1}{2}Cl_2(g) \rightarrow CuCl(s) \qquad \{Eq. 3.1\}$$

$$CuCl(s) + 2\,PEt_3(g) \rightarrow ClCu(PEt_3)_2(g) \qquad \{Eq. 3.2\}$$

where the notations (s) and (g) respectively represent the solid and gas phases. The ClCu(PEt$_3$)$_2$ product is highly volatile. To date, this reaction product has been measured as having a vapor pressure of 900 mTorr at 90° C. Etch rates as high as one micron per minute have been observed for the 2-step reaction of above Eq. 3.1 and Eq. 3.2.

Initial tests have shown that the 2-step reaction of above Eq. 3.1 and Eq. 3.2 can be carried out by first chlorinating copper in a plasma reactor such as the Lam Research 9600™ Transformer Coupled Plasma Metal Etcher mentioned above, and afterwards removing the reaction product by exposing it to a triethylphosphine (PEt$_3$) atmosphere at a pressure in the range of about 100 mTorr to 1.5 Torr and at a temperature in the range of about 200° C. to 300° C., and more preferably at 1.0 Torr and 260° C.

Exposure of the wafer to atmospheric air prior to treatment with PEt$_3$ was found to produce some residue, however. The residue is believed to be the result of copper chloride being converted by oxygen and/or water in the air to copper oxide, which latter compound could not be removed by PEt$_3$ treatment. Further experiments are planned to carry the 2-step reaction of above Eq. 3.1 and Eq. 3.2 entirely within the Lam Research 9600 TCP without allowing contact with the air.

In a second embodiment of FIG. 7, the first reactant X is oxygen while the second addend Y includes a Beta-diketone organic acid such as hfacH where the latter is a short hand notation for 1,1,1,5,5,5-hexafluoroacetylacetonate. The 2 step reaction proceeds as follows for conversion of copper (II) oxide:

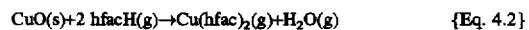

$$Cu(s) + \tfrac{1}{2}O_2(g) \rightarrow CuO(s) \qquad \{Eq. 4.1\}$$

$$CuO(s) + 2\,hfacH(g) \rightarrow Cu(hfac)_2(g) + H_2O(g) \qquad \{Eq. 4.2\}$$

where the notations (s) and (g) respectively represent the solid and gas phases.

The 2 step reaction proceeds as follows for the conversion of copper (I) oxide:

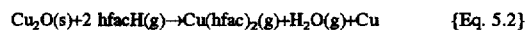

$$2\,Cu(s) + \tfrac{1}{2}O_2(g) \rightarrow Cu_2O(s) \qquad \{Eq. 5.1\}$$

$$Cu_2O(s) + 2\,hfacH(g) \rightarrow Cu(hfac)_2(g) + H_2O(g) + Cu \qquad \{Eq. 5.2\}$$

The excess copper metal of above Eq. 5.2 can be further oxidized and reacted with hfacH until all copper within the range of the anisotropic oxidizing reaction is removed.

The embodiment of FIG. 7 can be generalized into two broader categories of reactions in which a volatile copper salt is generated. In the first broad category, the copper film is first reacted with a halide X=(F, Cl, Br, I) while the second addend Y is a Lewis base of the form, L$_n$, where the number n can be 1 or 2 and represents the number of ligands attached to the copper atom. Above equations, Eq. 3.1–3.2 are then generalized by below equations Eq. 3.3∝3.4:

$$Cu(s) + X(g) \rightarrow CuX(s) \qquad \{Eq. 3.3\}$$

$$CuX(s) + L_n(g) \rightarrow XCuL_n(g) \qquad \{Eq. 3.4\}$$

where the notations (s) and (g) again respectively represent the solid and volatile (gas) phases. X represents a halide, L$_n$ represents a Lewis base such as PEt$_3$, and XCuL$_n$ represents the resultant, volatile copper salt. (It is understood that the above generalized reaction is not stoichiometrically balanced. It is also understood that the removal process takes place at appropriate pressure and temperature for which the resultant copper salt becomes volatile.)

In the second broad category, the copper film is first reacted with a Lewis base such as X=L$_n$=oxygen and then with an acid such as Y=hfacH to produce the copper salt. Above equations, Eq. 4.1–5.2 are then generalized by below equations Eq. 5.3–5.4:

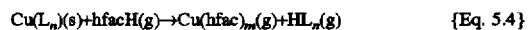

$$Cu(s) + L_n(g) \rightarrow Cu\,(L_n)(s) \qquad \{Eq. 5.3\}$$

$$Cu(L_n)(s) + hfacH(g) \rightarrow Cu(hfac)_m(g) + HL_n(g) \qquad \{Eq. 5.4\}$$

wherein m is equal to 1 or 2 and the volatile byproduct, Cu(hfac)$_m$ is responsible for the removal (etching away) of the solid copper. (It is understood that the above generalized reaction is not stoichiometrically balanced. It is also understood that the removal process takes place at appropriate pressure and temperature for which the resultant byproduct, Cu(hfac)$_m$, becomes volatile. A good range is about 150° C. to 300° C. and 100 mTorr to 1.0 Torr.)

Figure 8:
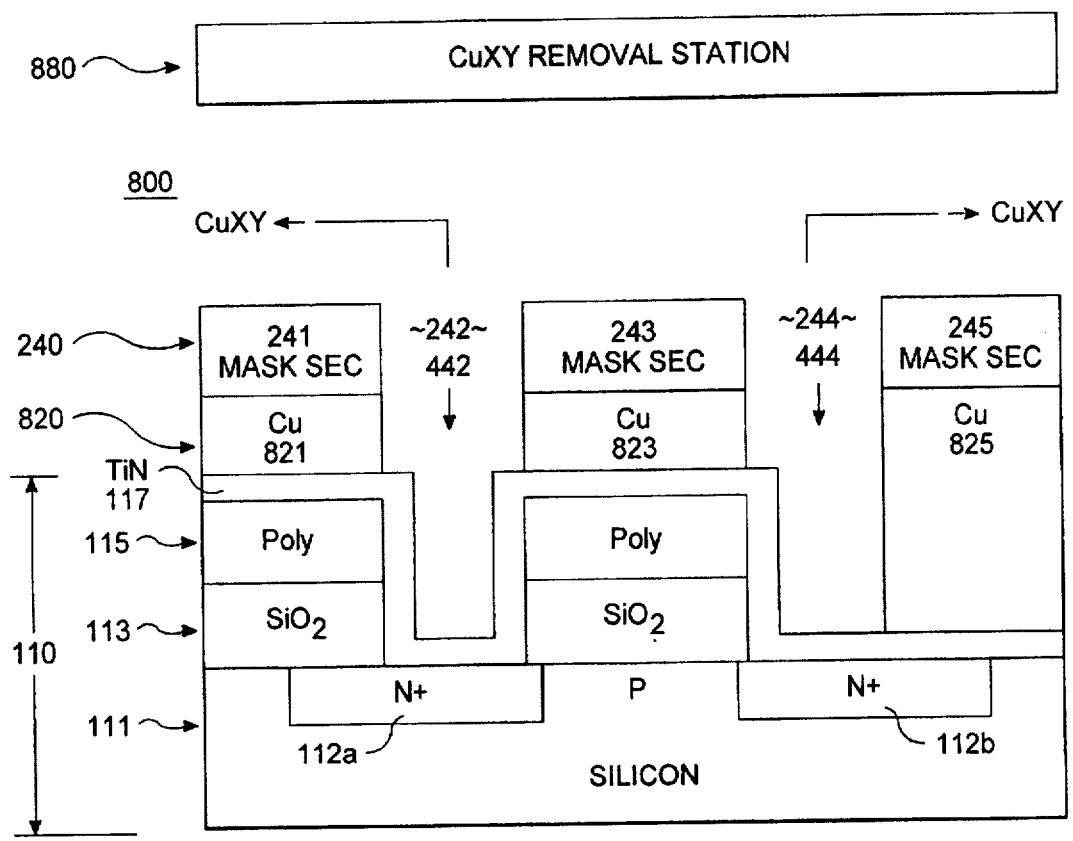
FIG. 8 is a cross sectional side view showing an alternate step following that of FIG. 7 and preceding the fifth step of FIG. 5, wherein the more-easily removable, second compound (CuXY) is removed.

FIG. 8 shows the CuXY removal station 880. In the case where the resultant second compound (CuXY) is highly volatile, an appropriate reaction chamber pressure is maintained for its removal. In the case where heat can be used to vaporize or facilitate the removal of the second compound (CuXY), the CuXY removal station 880 can include mercury-arc lamps or other heating means for carrying out or speeding the removal rate.

The resulting semiconductor structure 800 is next moved to the process steps of FIGS. 5 and/or 6 where undesired portions of the barrier layer 117 may be removed and, if the mask sections 241, 243, 245 have not yet been stripped away by a previous step, they can be now removed at the mask-stripping station 601. Thereafter, the resulting structure 600' (FIG. 8 followed by FIGS. 5,6) can be passivated with an overcoat of SOG, followed by addition of one or more further copper-based or other-metal-based interconnect layers if desired.

Figure 9:
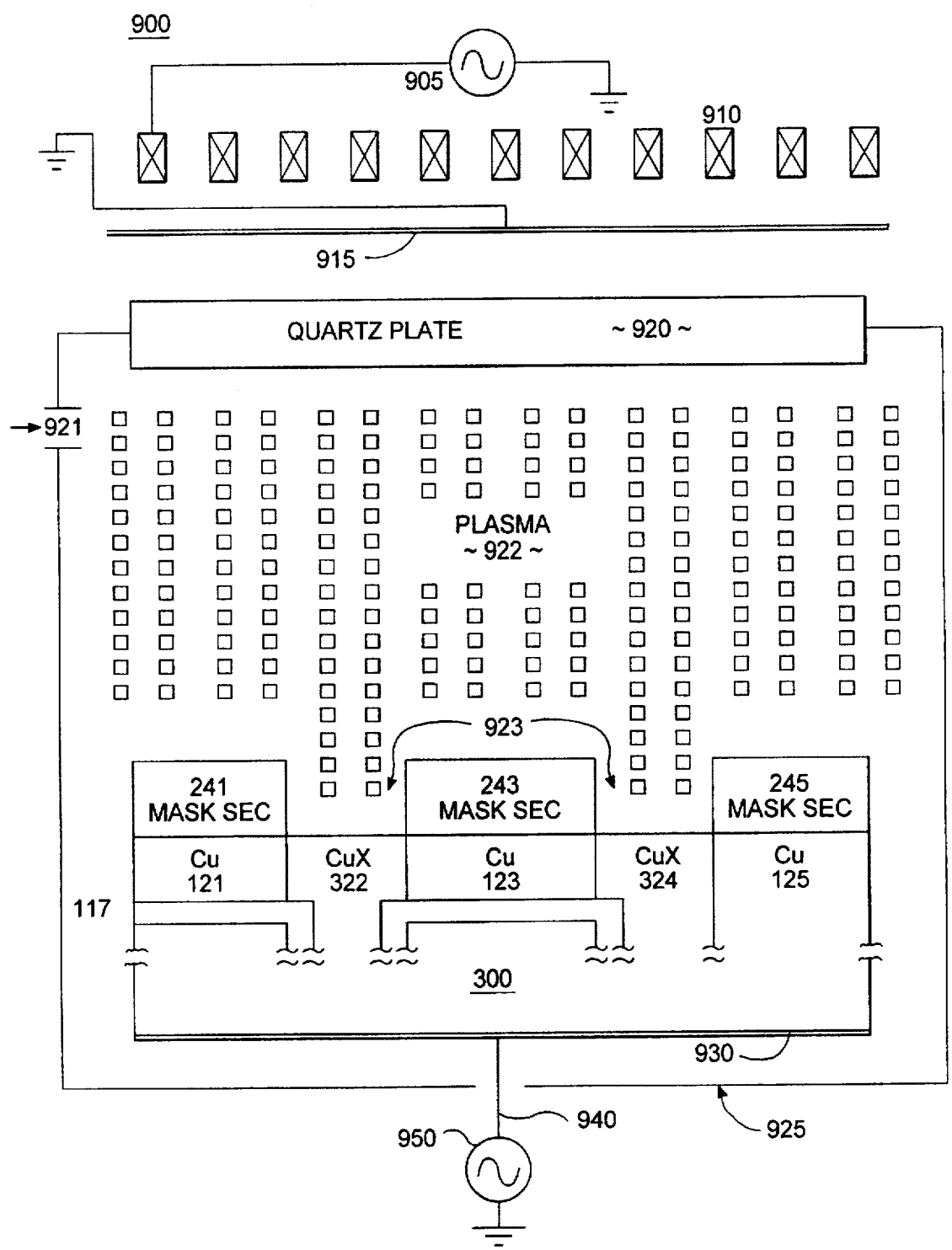
FIG. 9 is a cross sectional schematic of a plasma reactor that may be used for carrying out the anisotropic conversion processes of the invention.

FIG. 9 is a cross sectional schematic of a plasma reactor 900 that may be used to carry out anisotropic reactant introductions such as that of FIGS. 3 and 7. The plasma reactor 900 can be the above-mentioned Lam Research 9600™ Transformer Coupled Plasma Metal Etcher or an equivalent. Reaction chamber 925 includes a quartz plate 920 through which electromagnetic fields propagate for establishing plasma field 922. The plasma gas is introduced through port 921. A transformer coupled coil section 910 (cross section shown) is driven by a 13.56 MHz (or other standard frequency) RF power generator 905 to produce the magnetic fields. A ground plate 915 establishes the electric fields in conjunction with a bias RF generator 950. The bias RF generator 950 couples to the base section of wafer structure 300 by way of sealed electrode 940 and base clamp 930. The bias RF generator 950 operates at the same frequency (e.g., 13.56 MHz) as that of the RF power generator 905.

Although not shown, a temperature control subsystem may be incorporated into the chamber of the plasma reactor 900 to maintain a desired temperature (e.g., 100° C. or less). The temperature control subsystem may include a fluid-based heat exchanger for circulating a fluid of appropriate temperature through the chamber in order to maintain the desired chamber temperature.

With proper excitation of the RF power generator and the bias RF generator 950, a plasma field 922 is produced such that ions within the plasma oscillate up and down in a direction perpendicular to the top major surface of the wafer substrate 300. The lower portion 923 of the plasma field 922 is modulated to penetrate into subsurface portions of unmasked regions 122, 124 (see FIG. 2) to create converted regions 322, 324.

An example of reactor settings for the Lam machine are shown in below Table 2 both for the case of a chlorine plasma and for the case of an oxygen plasma.

TABLE 2

| PARAMETER SETTING | CHLORINE PLASMA | OXYGEN PLASMA |
|---|---|---|
| Chamber pressure (milliTorr) | 5 | 15 |

TABLE 2-continued

| PARAMETER SETTING | CHLORINE PLASMA | OXYGEN PLASMA |
|---|---|---|
| RF power generator 905 setting (Watts) | 400 | 270 |
| Bias RF generator 950 setting (Watts) | 130 | 250 |
| Chlorine flow (sccm) | 80 | — |
| Boron Trichloride (BCl$_3$) seed (sccm) | 30 | — |
| Oxygen flow (sccm) | — | 50 |
| Nitrogen flow (sccm) | — | 50 |
| Electrode gap (cm) | 3 | 6 |
| Helium pressure (Torr) | 6 | 12 |
| Electrode temp. (°C.) | 50 | 50 |

It is to be understood that the Table 2 settings are specifically for the Lam Research 9600™ etcher system and that other plasma reactors may require different settings.

In the case where an ion implanter is used for the anisotropic injection of the first reactant species (X) 360, implants may be made at different energy levels so as to distribute a substantially uniform distribution of the reactant X species 360 through the desired nonmasked portions 122, 124 of the copper-based layer 120.

The above disclosure is to be taken as illustrative of the invention, not as limiting its scope or spirit. Numerous modifications and variations will become apparent to those skilled in the art after studying the above disclosure.

By way of example, in the embodiment where ion implantation is used to form the compound CuX, a depth distribution process such as disclosed in the above-cited application Ser. No. 07/861,141 of T. Nakato can be used wherein different implant energies are used to implant the X species at different depths and heating follows to distribute the X species uniformly over the volume of the copper to-be removed.

Also, by way of further example, the selective convert and copper removal techniques disclosed herein can be performed subsequent to a selective copper deposition method such as disclosed in the above-cited application Ser. No. 08/036,049 of Greg Allen. An initial copper pattern can be defined by selective copper deposition, and then the initial pattern can be modified by means of the selective convert and copper removal techniques disclosed herein.

Additionally, although the disclosed step of patterned, anisotropic conversion can be formed by using conventional mask patterning techniques, or using a computer guided write beam, it is also amenable to use with submicron patterning techniques such as the phase-shift based process disclosed by the above-cited application Ser. No. 07/954,505 of David Vidusek et al. The anisotropic nature of the conversion process means that copper films can be patterned to have extremely fine features, with dimensions shrinking down even to the submicron range.

Given the above disclosure of general concepts and specific embodiments, the scope of protection sought is to be defined by the claims appended hereto.

What is claimed is:

1. A method for patterning a copper-based layer comprising the steps of:
   (a) providing said cooper-based layer on a substrate where said substrate has pre-defined conductivity regions formed therein;
   (b) anisotropically introducing, while said substrate is at a first temperature of approximately 100° C. or less, a reactant for converting preselected portions of the copper-based layer into a selectively removable compound;

(c) converting said preselected portions of the copper-based layer that include the introduced reactant into said selectively removable compound: and (d) selectively removing at a second temperature, the removable compound while leaving behind nonconverted portions of the copper-based layer, said second temperature being greater than the first temperature: and further wherein:

(b.1) said step (b) of anisotropically introducing is carried out in a first processing area that is thermally isolated from a second processing area; and (d.1) said step (d) of selectively removing at a second temperature is carried out in the second processing area.

2. A method for patterning a copper-based layer comprising the steps of:

(a) providing said copper-based layer on a substrate where said substrate has pre-defined conductivity regions formed therein:

(b) anisotropically introducing, while said substrate is at a first temperature of approximately 100° C. or less, a reactant for converting preselected portions of the copper-based layer into a selectively removable compound, the first temperature being essentially insignificant relative to a prespecified thermal budget of said substrate and its conductivity regions:

(c) converting said preselected portions of the copper-based layer that include the introduced reactant into said selectively removable compound; and (d) selectively removing at a second temperature, the removable compound while leaving behind nonconverted portions of the copper-based layer, said second temperature being greater than the first temperature: and further wherein: said step (d) of selectively removing includes:

(d.1) applying a solvent specific to the removable compound so as to selectively remove material from said preselected portions of the copper-based layer: said removable compound is a chloride of copper and said step (d.1) of applying a specific solvent includes using hot water having a temperature greater than 50° C. in the solvent: and said step of applying hot water is followed by an ethanol rinse.

* * * * *